United States Patent [19]

Dye

[11] Patent Number: 5,184,320
[45] Date of Patent: Feb. 2, 1993

[54] CACHED RANDOM ACCESS MEMORY DEVICE AND SYSTEM

[75] Inventor: Thomas A. Dye, Cedar Park, Tex.

[73] Assignee: Texas Instruments Incorporated, Dallas, Tex.

[21] Appl. No.: 484,446

[22] Filed: Feb. 21, 1990

Related U.S. Application Data

[63] Continuation of Ser. No. 155,668, Feb. 12, 1988, abandoned.

[51] Int. Cl.⁵ .................... G11C 15/04; G06F 12/00
[52] U.S. Cl. ........................... 365/49; 395/425;
    365/189.07; 365/189.05; 364/DIG. 1;
    364/243.41
[58] Field of Search .............. 365/49, 189.01, 189.07,
    365/230.03, 230.09, 189.05; 395/425

[56] References Cited

U.S. PATENT DOCUMENTS

| | | | |
|---|---|---|---|
| 4,167,782 | 9/1979 | Joyce et al. | 364/200 |
| 4,168,541 | 9/1979 | DeKarske | 365/49 X |
| 4,219,883 | 8/1980 | Kobayashi et al. | 365/49 X |
| 4,577,293 | 3/1986 | Matick et al. | 365/189 |
| 4,580,240 | 4/1986 | Watanabe | 365/49 X |
| 4,685,082 | 8/1987 | Cheung | 365/49 |
| 4,758,982 | 7/1988 | Price | 365/49 X |

FOREIGN PATENT DOCUMENTS 0095033 11/1983 European Pat. Off. .............. 365/49

OTHER PUBLICATIONS

Goodman, et al., "The Use of Static Column RAM as a Memory Hierarchy", IEEE, 1984, pp. 167-174.

*Primary Examiner*—Alyssa H. Bowler
*Attorney, Agent, or Firm*—Lawrence J. Bassuk; Robby T. Holland; Richard L. Donaldson

[57] ABSTRACT

A device for reducing access time to RAM arrays, especially DRAMs, by including fast access cache rows, e.g., four rows, to store data from accessed rows of the array, where data can then be accessed without precharging, row decoding sensing, and other cycling usually required to access the DRAM. Address registers, comparators, and MRU/LRU register and other cache control logic may be included in the device. The device allows parallel transfer of data between the RAM array and the cache rows. The device may be constructed on a single chip. A system is disclosed which makes use of the cache RAM features in a data processing system to take advantage of the attributes of a cache RAM memory.

6 Claims, 6 Drawing Sheets

CACHED RANDOM ACCESS MEMORY DEVICE AND SYSTEM

This application is a continuation of application Ser. No. 07/155,668, filed Feb. 12, 1988, now abandoned.

TECHNICAL FIELD OF THE INVENTION

The present invention pertains to random access memory devices, and particularly dynamic random access memory devices (DRAM) with the capability for on-chip cache memories.

BACKGROUND OF THE INVENTION

High density memory devices, for example DRAMs, require relatively long access times to retrieve information bits from a specified location. For example as the number of memory cells per device increases, as for example from 32K bits to 64K bits to 1M bits and beyond, the required access time becomes longer and the individual access time becomes more critical due to the increased number of accesses required from a large memory device. In the prior art, cache memory systems have been developed to store segments of the information from a large memory device or system used in mainframes or minicomputers into a smaller faster memory device or system which has faster access time. Then, to retrieve a specific information bit which is located in the cache memory, requires a short access time, while an information bit not located in the cache memory requires a longer time to access from the main memory device.

However, cache memory systems have, heretofore, been seldom applied to microcomputer systems or to single chip memory arrays for several reasons. Firstly, the memory capacity of main memories in these devices was not sufficiently large to warrant cache memory use. Further, control of cache memory systems was felt to require unjustified occupation of processor capabilities in smaller systems. Further, the employment of cache memory systems was not flexible enough for employment in the microcomputer environment. Further, use of cache memory was too costly for the benefit in speed which their use provided to microcomputer systems.

SUMMARY OF THE INVENTION

The instant invention provides for a cache memory system to be employed with a random access memory array wherein the system has the capability of locating the RAM array, the cache memory, a major portion of the control and the monitoring functions on one chip.

The invention further provides for an economical package which can be advantageously employed in today's microcomputer systems.

The invention further provides for a system which allows for flexibility in incorporation into a range of computer systems.

The invention further provides for fast transfer of data between the main memory array and the cache memory by completely parallel transfer of data.

The invention further provides for standardization of cache memory architecture and functions while allowing the system designer to customize decision steps to the specific systems.

These advantages and others are embodied in the invention as fully described by the following figures and description.

BRIEF DESCRIPTION OF THE DRAWING FIGURES

FIG. 5 is a timing diagram for a read or write back operation of the preferred embodiment when the cache is missed and the cache has been written to.

FIG. 6 is a timing diagram for a read or write operation of the preferred embodiment when the cache is missed and the cache row has not been written to.

DETAILED DESCRIPTION OF THE INVENTION AND THE PREFERRED EMBODIMENT

Figure 1:
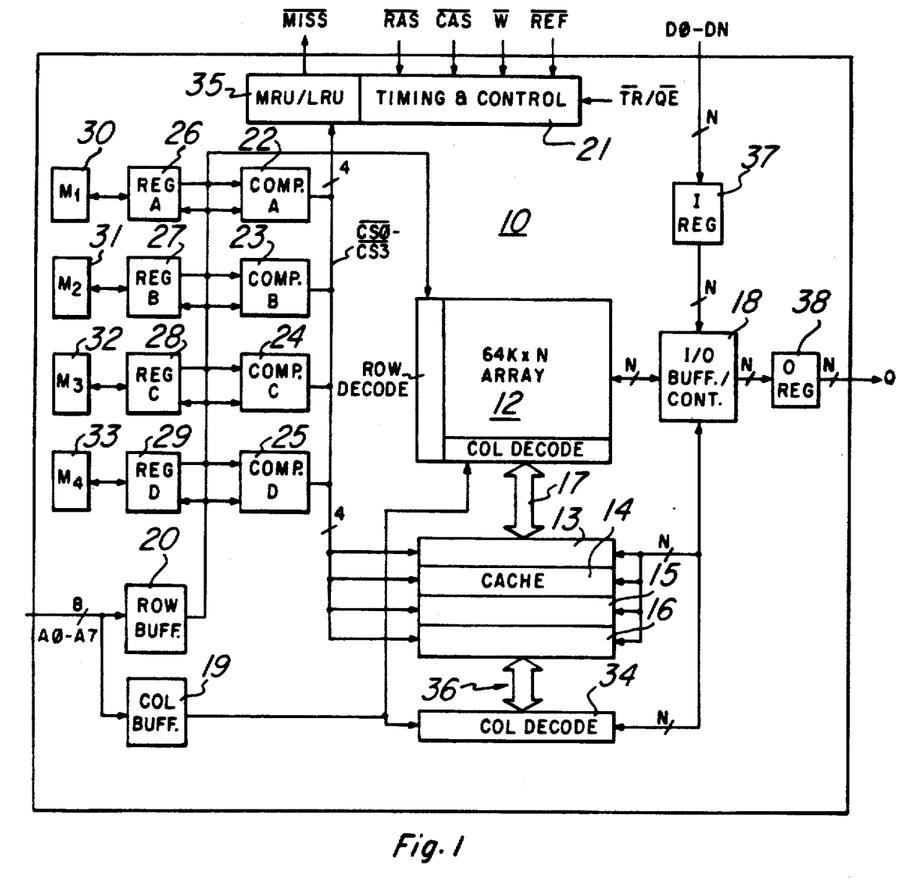
FIG. 1 is a block diagram of the cache memory system applied to a 64K DRAM array.

Referring to FIG. 1, there is provided a DRAM array 12 of known configuration having, for example, 256 rows of 256 memory cells (not shown) arranged in columns resulting in a 64K device. As is known in the art, a DRAM array is commonly read or written to by transferring the signal from each memory cell in a specified row simultaneously to a bank of sense amplifiers associated with the array where the individual signals are sensed, amplified and latched. Then a specified column of the signal stored in the sense/amplify row is input to (write) or output (read) by known means from the system. Typically, for a 64K DRAM, for example, the access time encompassing this read or write cycle is approximately 120 nanoseconds. Also, typically a DRAM array requires a refresh mode during which the memory cells are "refreshed" by applying a refresh voltage across the capacitive element of the cell. Typically, also, the DRAM array will include, on-chip, a timing and control circuit 21 which receives inputs from an outboard source, such as a microprocessor, and in a known manner, controls the access to specified row and column addresses in the array, read out or write to these addresses, the refresh cycle of the CDRAM, and data output. The inputs typically include Row Address Strobe ($\overline{RAS}$), Column Address Strobe ($\overline{CAS}$), Write ($\overline{W}$), Refresh ($\overline{REF}$), and an Output Enable Signal ($\overline{TR/QE}$), although it is pointed out that a Refresh ($\overline{REF}$) is not required because a refresh may be initiated by a $\overline{CAS}$ signal change of state before $\overline{RAS}$ signal change of state, as is well known in the art. Although FIG. 1 (and FIG. 7) depicts a $\overline{REF}$ pin input, these pins are not required. The operation and control of a memory array and particularly a DRAM is well known as described, for example in U.S. Pat. No. 4,081,701, assigned to Texas Instruments, Incorporated and incorporated herein by reference. The operation and control of a DRAM array, as well known, do not form a part of the instant invention except as the operation and control is modified to accommodate cache operation as fully explained below.

Associated with the array in the instant invention are a number, in this case four, of cache memory lines 13, 14, 15, and 16 each having one row of memory cells (not shown). In this example for a 64K DRAM there would be typically 256 memory cells in each row. The cache memory lines are each in communication with the DRAM array via a parallel, two-way loader 17 having, in this example, 256 channels. The loader is also in parallel communication in a known manner with a column decode line 34. The column decode line is in communication with an input/output buffer and control 18 which holds the input or output temporarily and controls the communication of these signals with the systems off-chip via an output pin DQ.

Registers 26, 27, 28, and 29 are uniquely associated with one each of the cache memory lines 13 through 16 having a storage capability to store a row address representing a row address of the DRAM array.

The registers 26–29 are each in communication with, in this case, one of four comparators 22, 23, 24, and 25 and with a row address buffer 20. The comparators 22-25 function to compare an input row address with the row address stored in the registers 26–29. The comparators 22-25, in turn, are in communication with a Most Recently Used/Least Recently Used (hereinafter MRU/LRU) register 35 and, by a controlled addressing method such as multiplexed bus line or multiple buses, are also in communication with the cache memory lines. The row buffer 20 and the column buffer 19 are connected under control of the timing and control circuitry 21 to input pins (typically A0-A7) for input of a row and column address from an off-chip source such as a microprocessor. The column buffer 19 is in communication with the column decoder line 34 and the sense-amplify bank (not shown) of the DRAM array.

Also in communication with each of the four registers 26–29 is one of the four flag registers 30, 31, 32, and 33. These registers can be merely two-state registers used to latch and store whether the cache line associated has been changed by a write cycle from an external source to a cache line (i.e., data in the cache line differs from that stored in the corresponding row of the array.).

Figure 7:
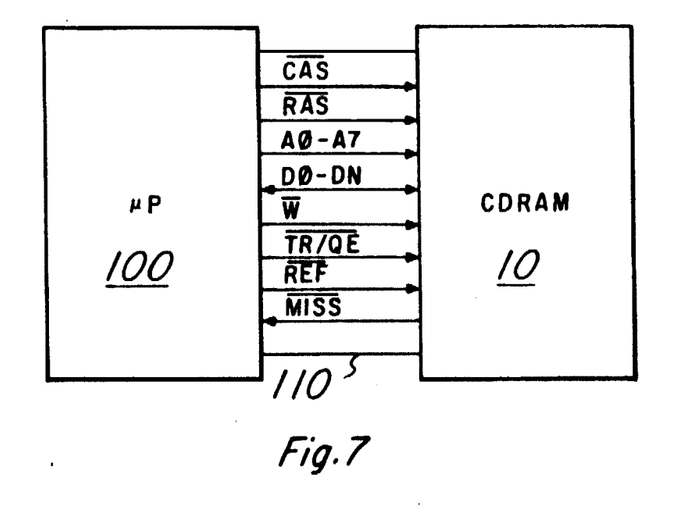
FIG. 7 is a block diagram of a data processing system utilizing a cached RAM.

FIG. 7 illustrates a block diagram of a data processing system employing a cached RAM. A processor 100, which may be a microprocessor, a data control chip or other system processor is in communication via, e.g., a bus 110 for communicating control signals (e.g., CAS, RAS, W, TR/QE, and REF), Addressing signals (A0-A7), data signals (D0-DN) and other signals not shown, to a cached DRAM 10.

The operation of the cached RAM array will now be explained. Referring now to FIG. 2A-2C and FIGS. 3-6, all operations of the system are initiated by a change of state of the RAS signal from the processor to cause the row address or some representation of the row address to be latched on the RAM device. Note that the flow diagram indicates all actions accomplished by the data processor in the preferred embodiment by the symbol "*" placed in the box describing that action. However the instant invention is not limited to the division of operations indicated in the preferred embodiment since some operations may be performed either by the memory device or by the associated processor or may be performed by both elements of the system in cooperations. After latching of the row address, the RAM device performs the comparison of the latched address with the addresses sorted in the registers 26–29. The RAM device then indicates a "miss" to the processor by change of state of the signal on the MISS pin if the latched row address does not appear in the registers as illustrated by the state of the MISS pin in FIGS. 4–6, of a "hit" if the latched row address does appear in the registers by the state of the MISS pin staying high as illustrated in FIG. 3.

The desired state of the operation is, of course, that the cache is "hit". In the case of a cache "hit", referring now specifically to FIG. 3 and the "yes" branch of the "hit" decision block in FIG. 2A, the MISS signal will remain high signaling the processor that the row desired is stored in the cache. The processor will then bring CAS low and signal a read or write action by bringing W low for write or keeping W high for read. In the case of a read, the processor will also send TR/QE low to enable the output. At CAS low, the RAM will latch the column address from the A0-A7 pins, read the data from the designated column of the "hit" row of the cache, and output the data. The RAM also will update the MRU to indicate the most recently used cache row. In the case of write, as shown by the flow chart branch FIG. 2B, the processor will take W low, at which time the RAM latches the column address from the address pins (CAS low) and reads the input data from the processor on the DQ pin(s), the TR/QE signal remaining high. The RAM then writes the data to the least recently used or otherwise selected cache row, updates the MRU, and sets the M bit flag. The M bit flag indicates that the cache row has been written to and is therefore different than the associated row in the array.

The operation in the hit mode is, of course, very time saving since the RAM row does not have to be accessed, no precharge time, typically required in accessing a DRAM array, is needed, no row decode is required, and sensing time is saved. The ratio of hit operations to miss operations depends upon a number of factors including number of cache rows, the data strategy of the processor and operating system, and the software in use. For a four row cache as illustrated by the preferred embodiment, hit ratios well in excess of 80% are generally obtained.

In the case of a miss, the operation of the system will be explained with reference again to FIGS. 2A-2C and FIGS. 4–6. On discovering a miss, the RAM indicates that situation by causing the MISS signal at the MISS pin to go low, for example. It will be understood that the system could make this indication by bringing the signal on the MISS pin from low to high or the system could be modified to indicate a hit by a change of state of the signal on an output pin, which would then appropriately be called the HIT pin, perhaps. Upon notice of the miss, the processing system has the opportunity to make a decision based upon any strategy which would be desirably implemented to improve the functioning and access time parameters of the system. The system will determine whether to "read/write back", wherein the row of the array desired to be accessed is transferred to a cache row so that future access from that row will result in a hit, or to "read/write through" wherein the RAM array is accessed in the conventional manner and the array row is not transferred to the cache.

Figure 2A:
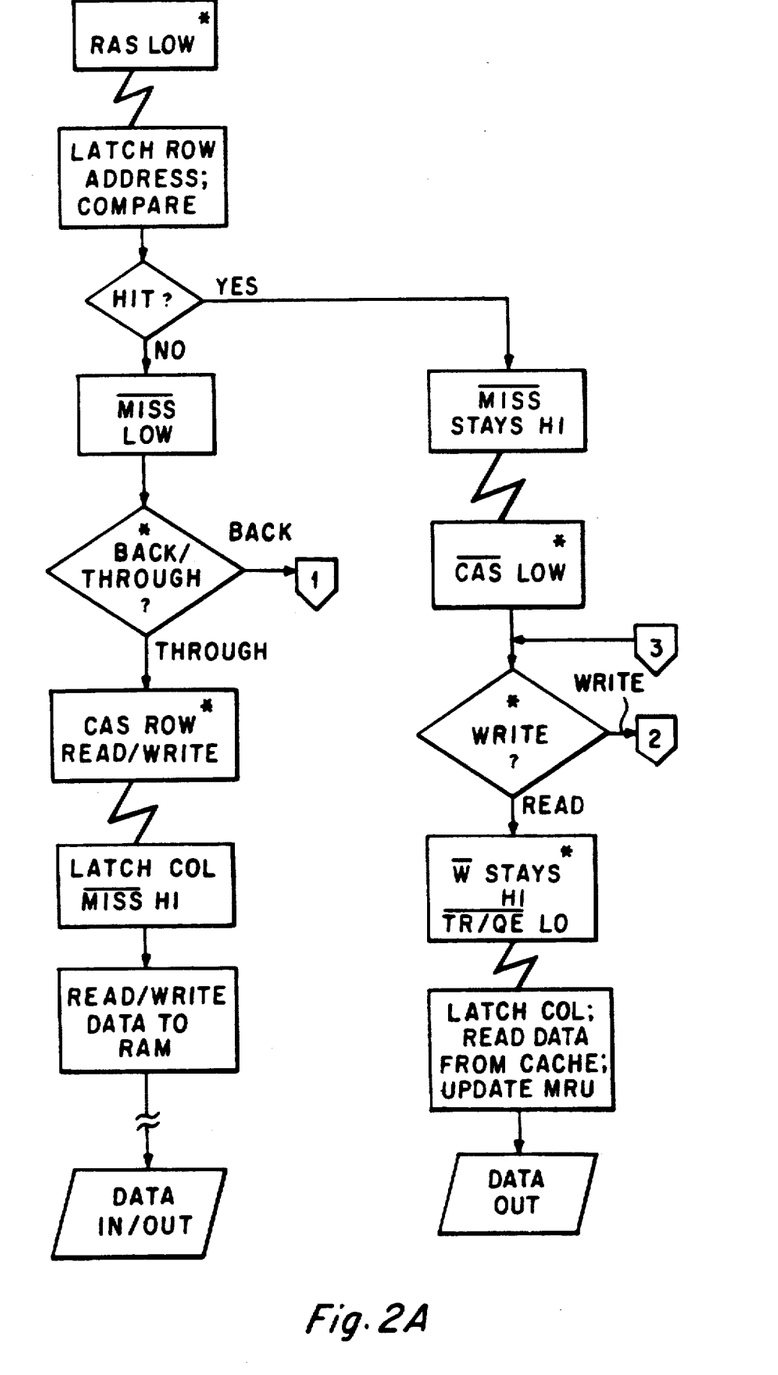
FIGS. 2A-2C are portions of a flow diagram for the operation of the preferred embodiment.
Figure 2B:
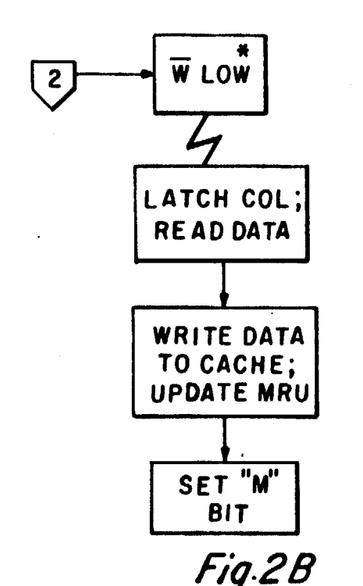
Figure 3:
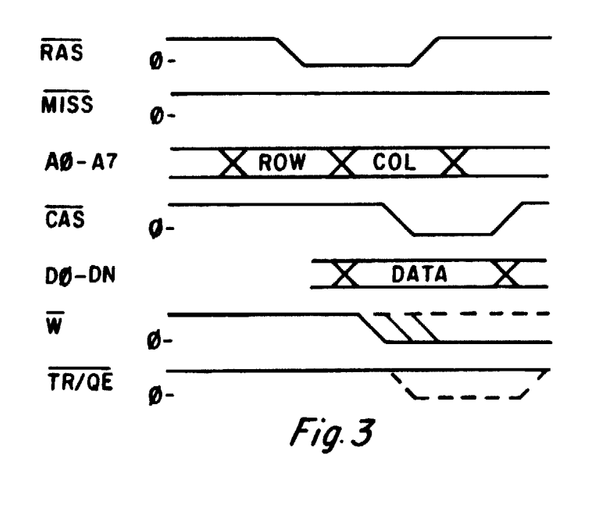
FIG. 3 is a timing diagram for a read or write operation of the preferred embodiment when the cache is hit.
Figure 4:
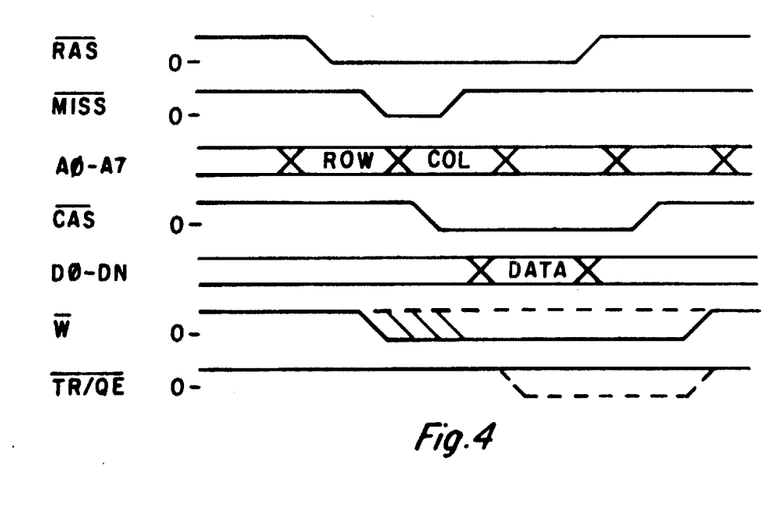
FIG. 4 is a timing diagram for a read or write through operation of the preferred embodiment when the cache is missed.

The processor, in the preferred embodiment operates to indicate a decision to read/write through by issuing a CAS low signal to the RAM as illustrated in the "through" branch of the "back/through" decision block of FIG. 2A in in FIG. 4, which is the timing diagram for a read or write through operation. The processor also issues a read or write order to the RAM by a change of state on the W pin. The RAM latches the column address, returns MISS to high, and reads or writes the data from or to the RAM array in a normal read or write such is well known in a typical DRAM operation.

The read/write back operation will be explained with reference to the "back" branch of the "back/through" decision block shown in FIG. 2C and the timing diagrams of FIGS. 5 and 6. Upon receiving the $\overline{\text{MISS}}$ low signal, the processor will cause the $\overline{\text{TR/QE}}$ signal to go low and the $\overline{\text{RAS}}$ signal to go high and then return to low. As seen in FIG. 6, the $\overline{\text{TR/QE}}$ signal will then be returned to high. The RAM thus is triggered to a read or write back operation. The RAM then determines internally whether the "M" bit is set for the LRU row. If the "M" bit is not set, indicating that the corresponding cache and RAM rows are still identical, the RAM latches the valid row address from the address pins and transfers the RAM row at that address to the least recently used cache row. The timing diagram for this operation is shown in FIG. 6. The RAM then returns the $\overline{\text{MISS}}$ pin signal to high, at which time the processor returns $\overline{\text{RAS}}$ to high, then low, and issues $\overline{\text{CAS}}$ low. The RAM then continues the operation in the same manner as a read or write when the cache is hit. This part of the operation was explained above.

Figure 2C:
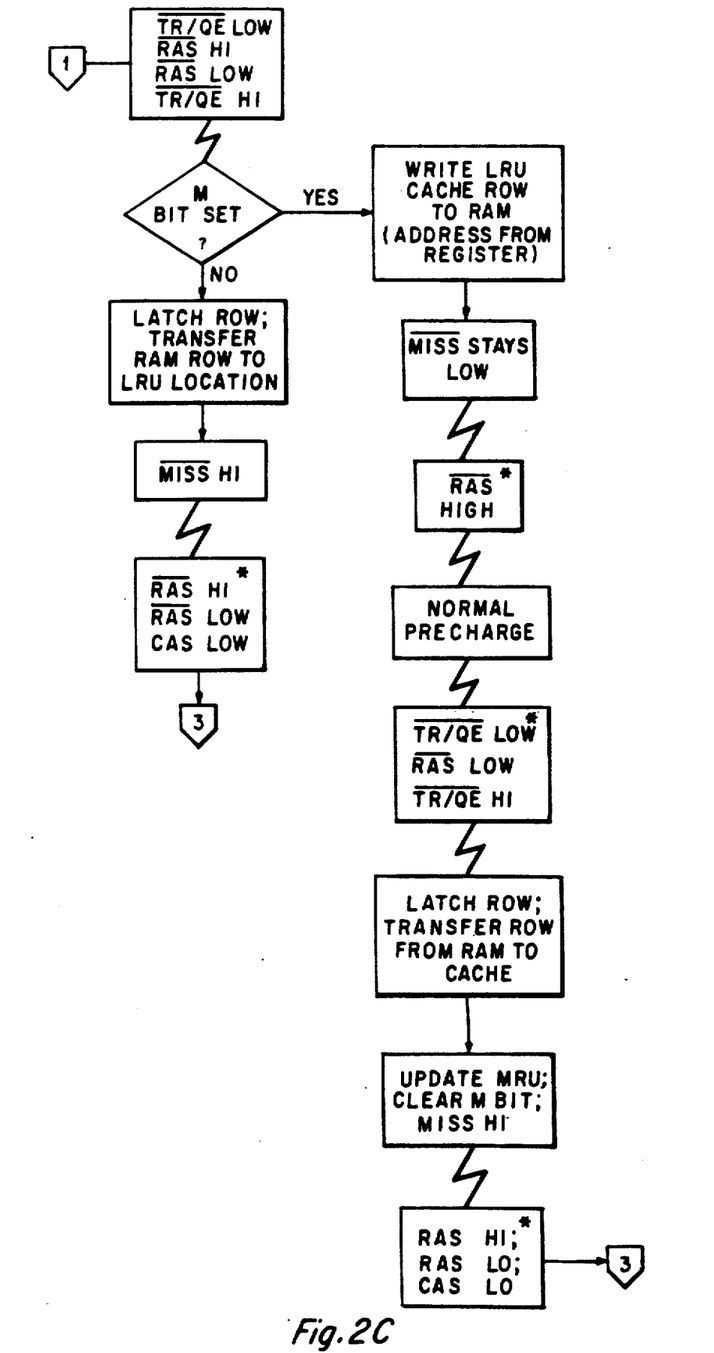
Figure 5:
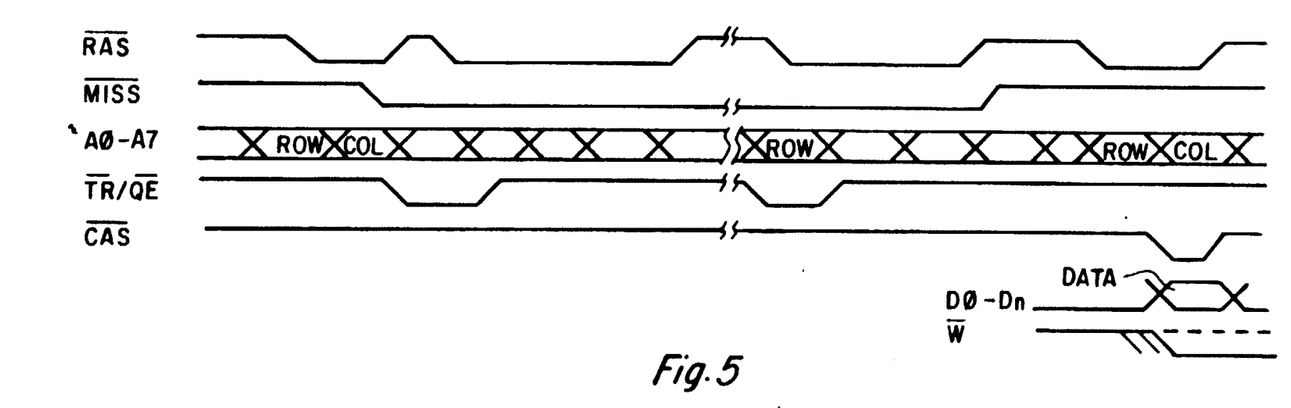
Figure 6:
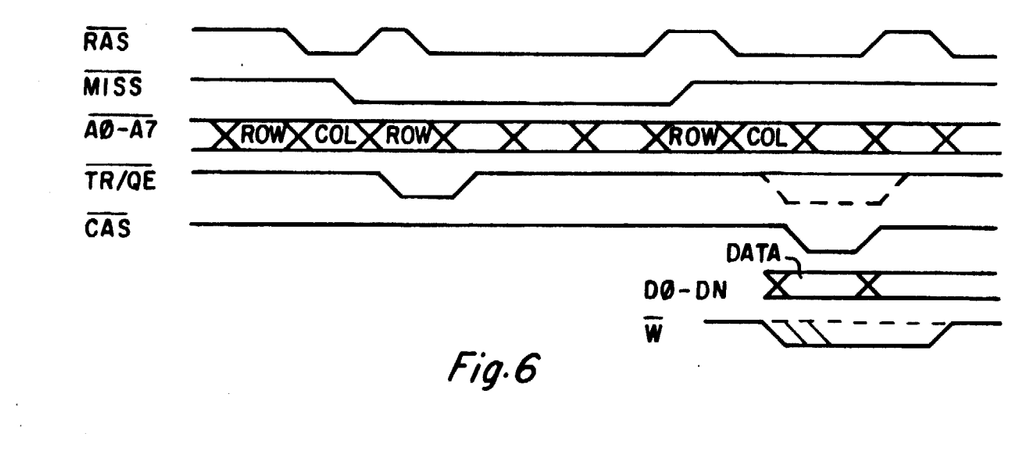

The operation when the "M" bit is set is shown at the YES branch of FIG. 2C and the timing diagram is at FIG. 5. The RAM determines that the "M" bit is set and proceeds to transfer the data from the least recently used cache row to the RAM array row at the address contained in the register for that cache row. (The processor then takes the RAS signal high.) The RAM keeps the $\overline{\text{MISS}}$ signal low, signaling the processor that another transfer is required. A normal precharge as is known in the operation of a DRAM can then be accomplished, after which the processor takes $\overline{\text{TR/QE}}$ low and issues a $\overline{\text{RAS}}$ low signal. The $\overline{\text{TR/QE}}$ signal is then returned high. At the $\overline{\text{RAS}}$ low, the RAM latches the valid row address at the address pins and transfers the addressed row from the RAM array to the cache row vacated by write back. Further the RAM updates the MRU/LRU register to put a new row in the MRU location, clears the "M" bit and then returns the $\overline{\text{MISS}}$ signal to high. The processor brings the $\overline{\text{RAS}}$ signal to high and then back to low and then brings the $\overline{\text{CAS}}$ signal to low. The operation is then continued in the same manner as for a cache hit as was previously explained.

The operation of the preferred embodiment of the invention has been described. By this embodiment, a main memory, a cache memory, timing and control logic, and status registers may be configured on one device or in one chip without sacrificing undue device space, allowing considerable flexibility of employment by the system configurer, and allowing great advantage in data access time. However the invention is not limited in scope to the embodiment described, inasmuch as numerous modifications are invisioned which are within the scope of the instant invention. For example, as mentioned before, elements and functions of the cached RAM of the preferred embodiment may be omitted from the device to be included on a separate device or omitted entirely. THE MRU/LRU register, the row address registers, or the comparators may each of all be configured separately, as examples. Also the elements of the preferred embodiment cached RAM may be modified. For example, the cache memory may be configured in more or less than four rows. The memory cells comprising the cache rows may be known four or six transistor SRAM type cells, DRAM type cells, or any data holding cells capable of meeting the access requirements of the system. The main memory array, although described in operation as a DRAM array may be other types of array such as an SRAM array. The registers described with reference to the preferred embodiment may be any type of device capable of associating an address or representative of that address. The comparators as described may be replaced in operation by a single comparator which is shared by techniques such as multiplexing of data. Further, the operation of the preferred embodiment may be much altered while remaining within the scope of the invention. Exemplary of these are the alterations which follow. Registers may be associated with each of the main memory array rows to register which of the rows of the array are stored in the cache and the address of the cache row used for that storage instead of a register associated with each cache row, as shown. And of course, the timing and control signals may be modified as was alluded to previously in the description of the operation of the invention. Further modification of the embodiment is contemplated which fall within the scope of the invention as covered by the appended claims.

What is claimed is:

1. An integrated circuit memory device having an on chip cache memory, comprising:

a memory array to store data, having memory cells operatively arranged in rows and columns, addressable through row address signals and column address signals;

a plurality of cache memory lines coupled to the memory array to store data, each cache memory line having its memory cells arranged in a row corresponding to a memory array row;

a circuit connected to the memory array and to the cache memory line that is responsive to the memory address signals to determine cache hits and cache misses, the circuit including;

a register, coupled to the memory array to store row address signals;

a comparator, coupled to the register and coupled to the plurality of cache memory lines, to determine cache hits and misses by comparing a received row address signal with a prior received row address signal stored in the register, a cache hit occurring when the received row address signal matches the stored row address signal, a cache miss occurring when the received row address signal does not match the stored row address signal; and a status register connected to the register to show whether the stored data in a cache memory line differs from the stored data in the corresponding memory array row.

2. An integrated circuit memory device having an on chip cache memory, comprising:

a memory array to store data, having memory cells operatively arranged in rows and columns, addressable through row address signals and column address signals;

a plurality of cache memory lines coupled to the memory array to store data, each cache memory line having its memory cells arranged in a row corresponding to a memory array row;

a circuit connected to the memory array and to the cache memory line that is responsive to the memory address signals to determine cache hits and cache misses, the circuit including;

a register, coupled to the memory array to store row address signals;

a comparator, coupled to the register and coupled to the plurality of cache memory lines, to determine cache hits and misses by comparing a received row address signal with a prior received row address signal stored in the register, a cache hit occurring when the received row address signal matches the stored row address signal, a cache miss occurring when the received row address signal does not match the stored row address signal; and a register, coupled to the comparator and coupled to the plurality of cache memory lines, to show the most recently used cache memory line.

3. An integrated circuit memory device having an on chip cache memory, comprising:

a memory array to store data, having memory cells operatively scanned in rows and columns, addressable through row address signals and column address signals;

a plurality of cache memory lines couples to the memory array to store data, each cache memory line having its memory cells arranged in a row corresponding to a memory array row;

a circuit connected to the memory array and to the cache memory line that is responsive to the memory address signals to determine cache hits and cache misses, the circuit including;

a register, coupled to the memory array to store row address signals;

a comparator, coupled to the register and coupled to the plurality of cache memory lines, to determine cache hits and misses by comparing a received row address signal with a prior received row address signal stored in the register, a cache hit occurring when the received row address signal matches the stored row address signal, a cache miss occurring when the received row address signal does not match the stored row address signal; and a register, coupled to the comparator and coupled to the plurality of cache memory lines, to show the least recently used cache memory line.

4. A cached dynamic random access memory chip formed on a single semiconductor substrate, comprising:

a dynamic memory array for holding data, having dynamic memory cells arranged in rows of X number of cells by columns of Y number of cells;

a cache memory for holding data, having cache memory cells arranged in rows of X number of cells;

a parallel loader for transferring data between a row of dynamic memory cells and a row of cache memory cells;

periphery circuitry for accessing the dynamic memory array cells and the cache memory cells, the periphery circuitry including:

a first register for storing a received row address access signal;

a comparator, coupled to the first register and coupled to the cache memory, for matching a received row address access signal with a previously received stored row address access signal;

output control circuitry, coupled to the dynamic memory array and coupled to the cache memory array, for outputting data from a row of the cache memory when a received row address access signal matches a previously received stored row address access signal; and a second register, coupled to the first register, for indicating the most recently used row of cache memory.

5. A cached dynamic random access memory chip formed on a single semiconductor substrate, comprising:

a dynamic memory array for holding data, having dynamic memory cells arranged in rows of X number of cells by columns of Y number of cells;

a cache memory for holding data, having cache memory cells arranged in rows of X number of cells;

a parallel loader for transferring data between a row of dynamic memory cells and a row of cache memory cells;

periphery circuitry for accessing the dynamic memory array cells and the cache memory cells, the periphery circuitry including:

a first register for storing a received row address access signal;

a comparator, coupled to the first register and coupled to the cache memory, for matching a received row address access signal with a previously received stored row address access signal;

output control circuitry, coupled to; the dynamic memory array and coupled to the cache memory array, for outputting data from a row of the cache memory when a received row address access signal matches a previously received stored row address access signal; and a second register, coupled to the first register, for indicating the least recently used row of cache memory.

6. The cached dynamic random access memory chip of claim 4 wherein the periphery circuitry further includes:

a third register, coupled to; the first register, for indicating whether the data stored in a row of cache memory is the same as the data stored in a row of the dynamic memory array corresponding to it.

* * * * *